United States Patent
Jacobs et al.

(10) Patent No.: US 8,928,467 B2
(45) Date of Patent: Jan. 6, 2015

(54) PROGRAMMABLE AUDIO DEVICE

(75) Inventors: Tony J. Jacobs, Virginia Beach, VA (US); Anthony F. Tesselaar, Virginia Beach, VA (US); Anthony I. Tesselaar, Virginia Beach, VA (US)

(73) Assignee: TJT Holdings, LLC, Virginia Beach, VA (US)

( * ) Notice: Subject to any disclaimer, the term of this patent is extended or adjusted under 35 U.S.C. 154(b) by 532 days.

(21) Appl. No.: 13/064,045

(22) Filed: Mar. 3, 2011

(65) Prior Publication Data

US 2011/0241849 A1    Oct. 6, 2011

Related U.S. Application Data

(60) Provisional application No. 61/311,506, filed on Mar. 8, 2010.

(51) Int. Cl.
*G08B 1/00*    (2006.01)

(52) U.S. Cl.
USPC .................. 340/309.7; 362/272; 362/274

(58) Field of Classification Search
USPC ................. 340/309.7; 362/272, 274
See application file for complete search history.

(56) References Cited

U.S. PATENT DOCUMENTS

| | | | |
|---|---|---|---|
| 5,195,064 A * | 3/1993 | Hegarty et al. | 368/272 |
| 5,812,064 A | 9/1998 | Barbour | |
| 7,731,686 B2 | 6/2010 | Edwards et al. | |
| 7,749,194 B2 | 7/2010 | Edwards et al. | |
| 8,172,082 B2 | 5/2012 | Edwards et al. | |
| 8,544,645 B2 | 10/2013 | Edwards et al. | |
| 2012/0294473 A1 | 11/2012 | Pierce et al. | |

FOREIGN PATENT DOCUMENTS

WO    2009/051476 A1    4/2009

* cited by examiner

*Primary Examiner* — Daryl Pope
(74) *Attorney, Agent, or Firm* — Griffin & Szipl, P.C.

(57) ABSTRACT

An apparatus allowing the recording and storage of data with a programmable timer alarm/alert. This data that can be either retrieved manually or automatically via audio playback or computer link.
For certain embodiments, the audio device is configured for mounting on a consumable item.
In a further embodiment the audio device may include and collect information regarding the consumer item on which it is mounted.
In yet another embodiment the audio device contains a timing device and an alarm function coupled to an actuator that can be set at predetermined intervals.

13 Claims, 7 Drawing Sheets

PROGRAMMABLE AUDIO DEVICE

The application claims priority from U.S. Provisional Patent Application No. 61/311,506 filed Mar. 8, 2010, the entire disclosure of which is hereby incorporated herein by reference.

FIELD OF THE INVENTION

The present invention relates generally to programmable audio devices and more particularly to a portable programmable audio device which is configured for attachment to a variety of consumer items.

BACKGROUND TO THE INVENTION

The use of medication to treat and prevent a variety of illnesses is very common in modern medicine.

Patients prescribed such medications are instructed to ingest or otherwise consume the medication at a prescribed dosage at regular intervals, e.g. twice daily.

Instructions for taking medication are typically provided on a prescription label affixed to the container in which the medication is dispensed.

The instructions provided may include higher level detail, e.g. to be taken before meals, after meals, at bedtime, as needed, etc.

Unfortunately, it is relatively common for patients to forget to take their medication, thereby impeding the effectiveness of the prescribed treatment and potentially putting the patient's health and well being in jeopardy.

Many patients are required to take multiple medications, and in some cases each medication is to be taken at different times and time intervals. For example, a first medication may be required to be taken morning and evening, and a second medication may be required to be taken only at night before sleep.

Accordingly, patients who are required to consume a number of medications on a regular basis can easily lose track of the dosage and time at which each particular medication should next be taken.

Various devices, systems and methods have been developed to aid in the correct timing of administration of medication by patients. Existing devices focus on providing a reminder to a patient to take medication at particular time intervals.

However, such devices do not attempt to address other problems associated with the consumption of prescription medication. For example, in the case of elderly and infirm patients, it is not uncommon for them to be unable to remember the particular dosage instructions associated with the medication, a problem that increases when a number of medications are prescribed for management of a particular illness.

Moreover, many patients find it difficult to read the instructions printed on prescription labels.

The above problems are ameliorated by the present invention which is described herein. Moreover, it will be understood that whilst the present invention has particular application in the context of the problems associated with dispensing medication, the device of the present invention has application in a wide variety of contexts.

SUMMARY OF THE INVENTION

According to an aspect of the present invention, there is provided a programmable audio device including:

(a) a memory circuit/static memory for storing audio data informational data;
(b) an audio processor and amplifier coupled to the microcontroller
(c) a realtime clock and crystal to keep time for alarm circuit attached to microcontroller
(d) a microcontroller to run the operations
(e) an actuator for switching the device between an ON condition and an OFF condition;
(f) an actuator for switching the device between an OPEN condition and CLOSED condition;
(g) a speaker for emitting the audio data when the device is in the ON condition; and
(h) a power source for supplying power to the device.

In an embodiment, the programmable audio device is configured for mounting on a consumer item.

In yet another embodiment, the audio data includes information regarding the consumer item on which the programmable audio device is mounted.

The programmable audio device may further include a connection port to facilitate connection of the device to a computing device for uploading the audio data.

In one form of the invention, the programmable audio device includes a timing device coupled to the actuator to cause the actuator to switch to an ON condition at predetermined intervals.

In a further embodiment, the programmable audio device is configured to be mounted on a container for dispensing a consumable. For example, the device may be adapted to be counted on a container for dispensing medication to provide information regarding the dosage and intervals at which the medication should be administered. In another example embodiment, the device may be adapted to be mounted on a soft drink bottle, for instance to provide the consumer with details regarding a promotional offer.

According to another aspect of the present invention, there is provided a programmable audio device configured to be mounted on a container for dispensing a consumable, the device including:

(a) a memory circuit/static memory for storing audio data informational data;
(b) an audio processor and amplifier coupled to the microcontroller
(c) a realtime clock and crystal to keep time for alarm circuit attached to microcontroller
(d) a microcontroller to run the operations
(e) an actuator for switching the device between an ON condition and an OFF condition;
(f) an actuator for switching the device between an OPEN condition and CLOSED condition
(g) a speaker for emitting the audio data when the device is in the ON condition; and
(h) a power source for supplying power to the device.
wherein the audio data includes information regarding the consumable stored within the container.

The information regarding the consumable may include one or more of the following:
(a) a description of the consumable;
(b) a series of instructions for consuming the consumable;
(c) a series of instructions for storing the consumable;
(d) an expiry date of the consumable;
(e) a description of a promotion associated with the consumable; or
(f) a series if encrypted information for emergency services in reference to the consumable.

In another embodiment, the device further includes a timing device coupled to the actuator to cause the actuator to switch to an ON condition at predetermined intervals.

In one form of the invention, the audio data further includes an alert signal. The alert signal may be an audio alert emitted at predetermined intervals. The alert signal may further include a visual alert or a vibratory mechanism.

The programmable audio device may further include a connection port to facilitate connection of the device to a computing device for uploading the audio or informational data.

BRIEF DESCRIPTION OF THE DRAWINGS

It will be convenient to hereinafter describe the invention in greater detail by reference to the accompanying figures which facilitate understanding of the method according to this invention. The particularity of the figures and the related description is not to be understood as superseding the generality of the broad identification of the invention as given in the attached claims.

DETAILED DESCRIPTION

Figure 1A:
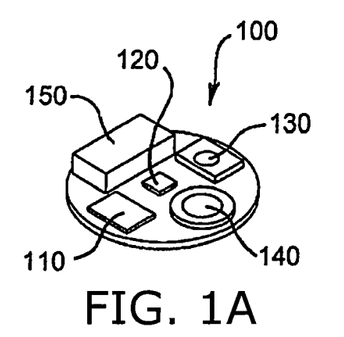
FIG. 1A is a perspective top view of the programmable audio device of the present invention.

Referring firstly to FIG. 1A, there is shown a top side of the programmable audio device 100. The programmable audio device 100 may include a memory circuit 110 for storing audio data and informational data. The audio and informational data may include, but is not limited to, pharmaceutical information; pharmacological information; batch information; sales information; product quantity; patient information such as the patient's name, age, weight; prescription information; patient history; product information; product safety information; product sales information; product refill information; product warning information; product side effects; product expiration dates; date and time; date and time of package opening; date and time of package closed.

Figure 1B:
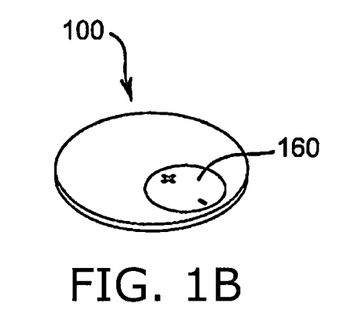
FIG. 1B is a perspective bottom view of the programmable audio device of FIG. 1A.

The audio and informational data may be stored in the form of one or more audio or informational data files. In one alternative embodiment, the data may be stored in an encrypted data section, wherein only certain personnel can upload or store data in the programmable audio device 100. For example, the data section may be encrypted such that only a pharmacist or medical personnel has the ability to store information on the data section to ensure accuracy and preclude tampering with the data information. The programmable audio device 100 may further include an audio processor 120 coupled to the memory circuit 110. An actuator 130 is provided for switching the programmable audio device 100 between an ON condition and an OFF condition together with a speaker 140 for emitting the audio data when the device is in the ON condition. Referring now to FIG. 1B, the programmable audio device 100 includes a power source 160 for supplying power to the programmable audio device 100.

Whilst the components of the programmable audio device 100 are exposed in the illustrated embodiments, it is to be understood that they are likely to be and able to be encapsulated or otherwise hidden from view for aesthetic purposes.

Audio and encoded informational data files may be uploaded to the programmable audio device 100 from a computing device or similar by a connection port 150 provided on the programmable audio device 100. The connection port 150 may take the form of a USB port or other port known to those skilled in the art. This facility enables the device to be intermittently programmed with audio files and informational data which provides information for a specified purpose. For instance, where the programmable audio device 100 is configured for mounting on a consumer item, the audio data includes information regarding the consumer item on which the programmable audio device is mounted.

The power source 160 supplies power to the programmable audio device 100. The power source may be a portable power source such as battery. The battery may be of the disposable or rechargeable type. Alternatively, the power source may comprise a solar cell.

The programmable audio device 100 may be integrally formed with the consumer item, or alternatively may comprise and independent unit adapted to be mounted a variety of items. Accordingly, it is envisaged that the programmable audio unit could be programmed and mounted on a first item and then reprogrammed and mounted on a second item after it has served its purpose with regard to the first item.

Figure 2:
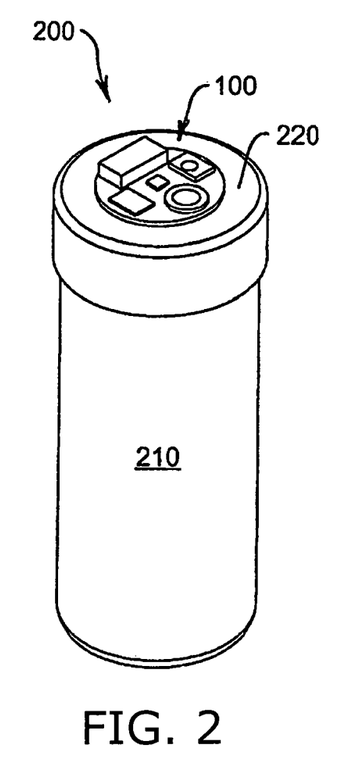
FIG. 2 is a perspective view of the programmable audio device mounted on a container for dispensing medication in accordance with an embodiment of the present invention.
Figure 3:
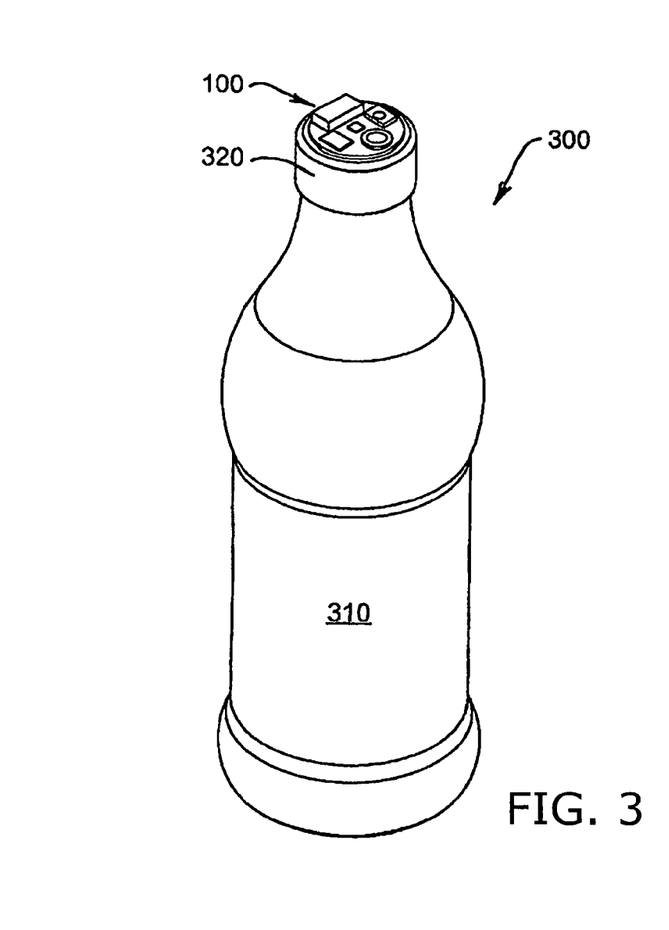
FIG. 3 is a perspective view of the programmable audio device mounted on a soft drink bottle in accordance with another embodiment of the present invention.

Referring now to FIGS. 2 and 3, the programmable audio device 100 may be configured to be mounted on a container for dispensing a consumable. As shown in FIG. 2, the device 100 is particularly adapted to be mounted on a container 210 for dispensing medication such as pills, capsules, tablets, and-the-like that are typically supplied by a pharmacist in standard plastic containers. The device 100 may be integrally formed with the container cap 220 or could be located on the cap with an actuator exposed to enable the device to be switched between the ON condition and the OFF condition.

In the context of dispensing medication, the audio data stored on the device may include a description of the medication stored within the container, together with a series of instructions for administering the medication. The instructions would typically define the dosage and intervals at which the medication should be taken together with any special instructions, e.g. to be taken with meals, or to be taken on an empty stomach.

The audio data stored on the programmable audio device 100 therefore effectively replaces the conventional written label that is adhered to the prescription bottle. It is intended that the device would be programmed by the pharmacist who is responsible for dispensing the medication. In this particular embodiment, it may be desirable to provide some element of security to the programmable audio device to prevent unauthorized persons from tampering with the audio data stored thereon.

The programmable audio device 100 can be simply switched ON by a patient depressing or otherwise activating the actuator to determine the contents of the container and the instructions for administering them. Other information that may be included in the audio file includes a series of instructions for storing the medication, or an expiry date of thereof.

The programmable audio device also be programmed with additional coded informational data such as codes or information pertaining to either the customer product or items contained for safety, record keeping and or tracking purposes. This is included but not limited to pharmacological data, warnings, drug information, side effects, patient history The programmable audio device 100 may further include a timing device (not shown) coupled to the actuator 130 to cause the actuator to switch to an ON condition at predetermined intervals. The timing device may include a first countdown function to determine the number of times that a container has been opened, and a second countdown function to determine a duration before the container should be opened next. Once the second countdown is complete, a reminder alert is emitted to alert the patient that it is time to administer the next dose of medication. The first countdown function may also be associated with an alarm to alert the patient that there are only "x" doses of medication remaining and it is time to obtain a prescription refill.

For example, where a timing device is present, depressing the actuator on the device once may identify the patient and advise the dosage and frequency at which the medication should be administered. Depressing the actuator twice, may initiate the countdown sequence and reminder alarm.

It will be readily understood that the programmable audio device has particular advantages in this context which include the facility to act as an audible reminder to the patient, as well as providing critical information regarding administration of the medication that is readily available. This is particularly beneficial for the patient who is visually impaired or patients with impaired memory function.

In addition to the audio data the programmable audio device may further emit a visual or tactile signal as an alert or reminder to the patient. For instance, the audio alert could be accompanied, preceded or superseded by a visual alert, for example provided by a flashing LED, or a tactile alert provided by a vibratory mechanism. The type and order of the secondary alerts can be programmed in accordance with the needs of the user.

Referring now to FIG. 3, the programmable audio device 100 is adapted to be used in conjunction with other types of consumer items such as for example a soft drink bottle 300. In this embodiment, the device 100 may be mounted to or integral with the bottle cap 320.

When activated the device 100 may provide the consumer with details of a promotion associated with purchase of the soft drink for example. The device 100 may be actuated by the consumer depressing or otherwise activating the actuator as previously described, or alternatively the actuator could be triggered to the ON condition by the act of removing the bottle cap 320 from the soft drink bottle 310.

Figure 4:
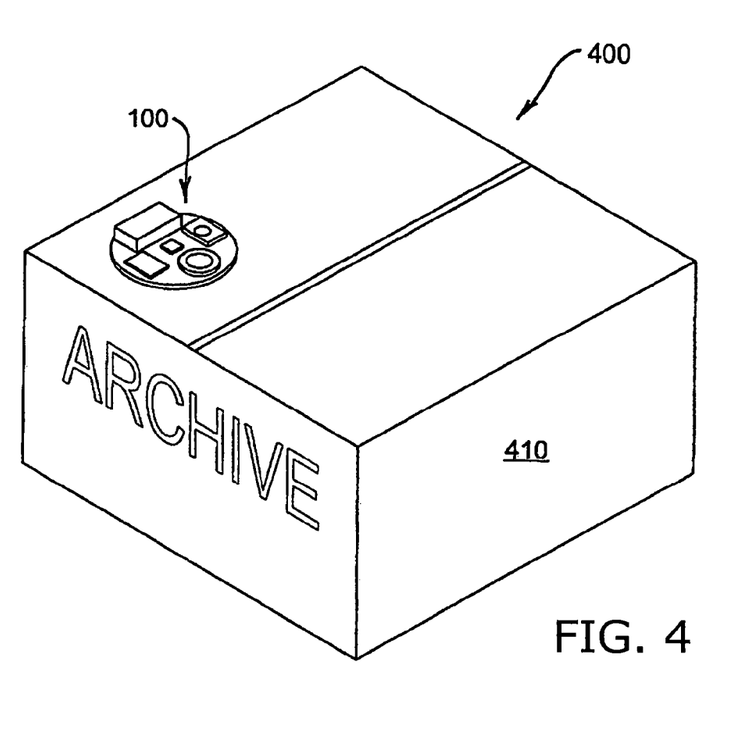
FIG. 4 is a perspective view of the programmable audio device mounted on an archive box in accordance with still another embodiment of the present invention.

Referring to FIG. 4, the programmable audio device 100 is also adapted to be attached to any other type of container or similar such as the archive box 410 depicted in FIG. 4. Actuating the device 100 causes an audio message regarding the contents of the box for example, to be emitted from the speakers 140 provided by the device.

Figure 5:
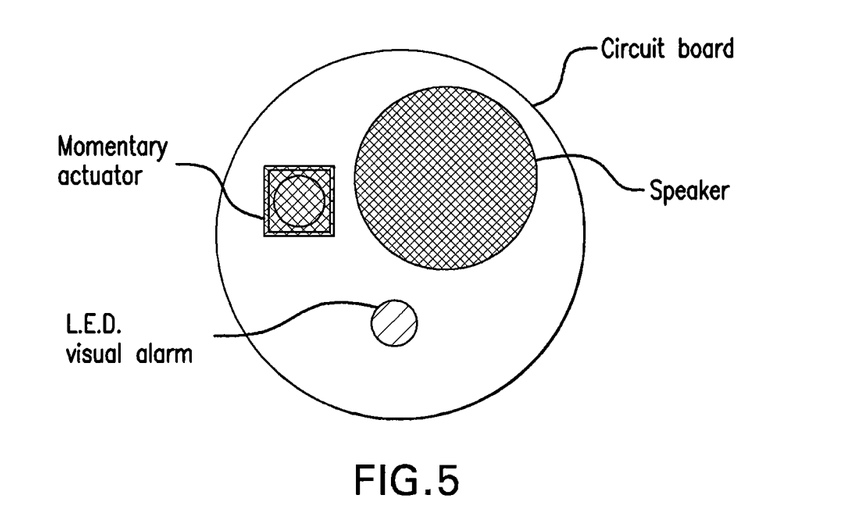
FIG. 5 is a top view of one embodiment of the programmable audio device.
Figure 6:
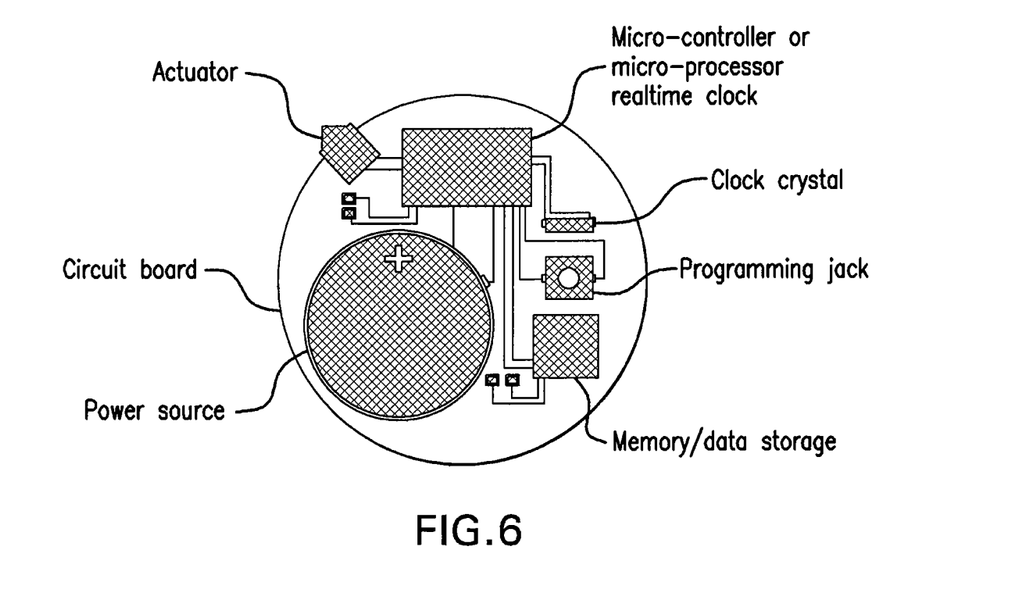
FIG. 6 is a top view of the device showing an arrangement of components.
Figure 7:
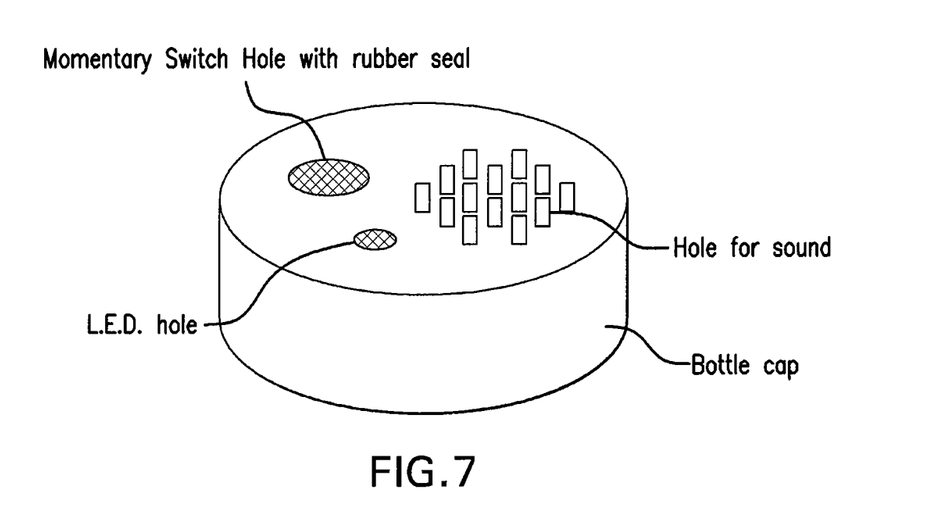
FIG. 7 is a perspective view of the cover.
Figure 8:
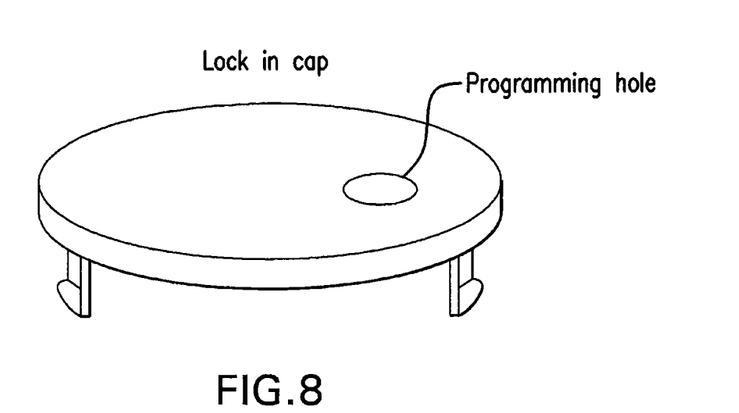
FIG. 8 is a perspective view of a lock in cap with a programming hole.
Figure 9:
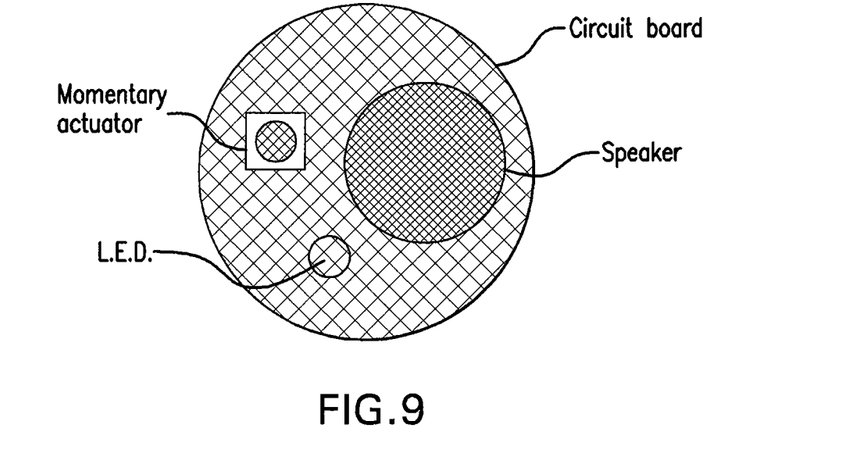
FIG. 9 is a top view of the some of the components in the circuitry.
Figure 10:
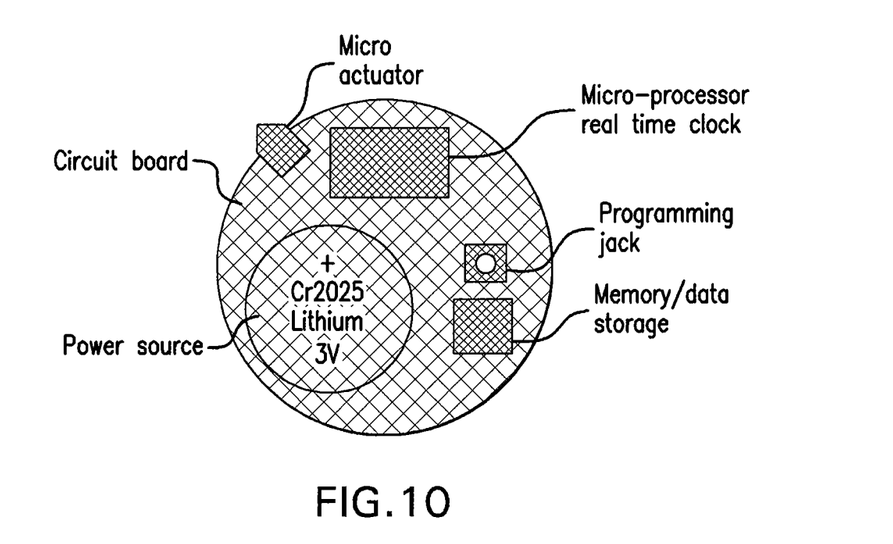
FIG. 10 is a top view of some of the components in the circuitry.
Figure 11:
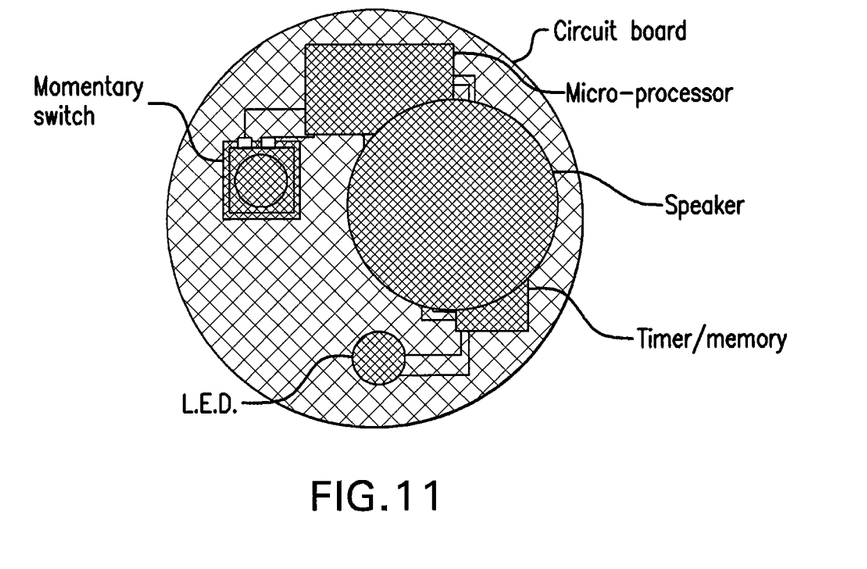
FIG. 11 is a top view combining components from FIGS. 9 and 10.
Figure 12:
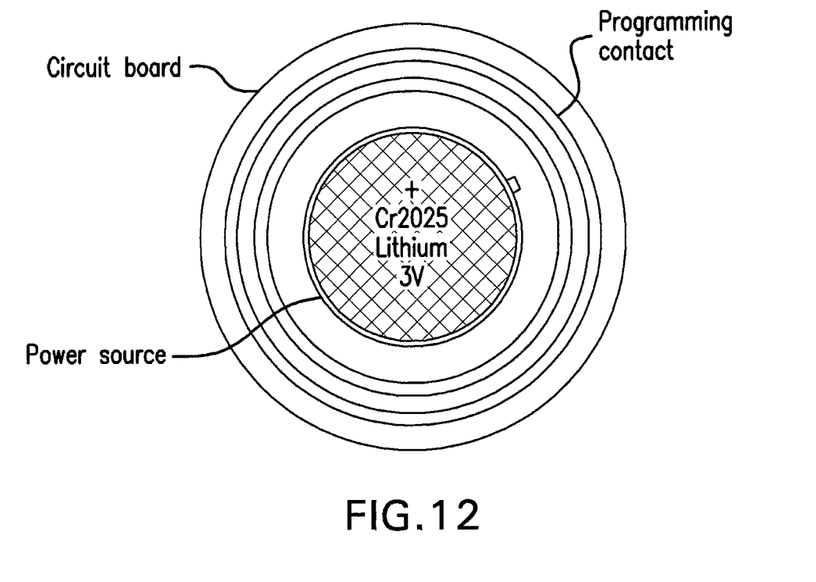
FIG. 12 is a top view of the power source and contact rings.
Figure 13:
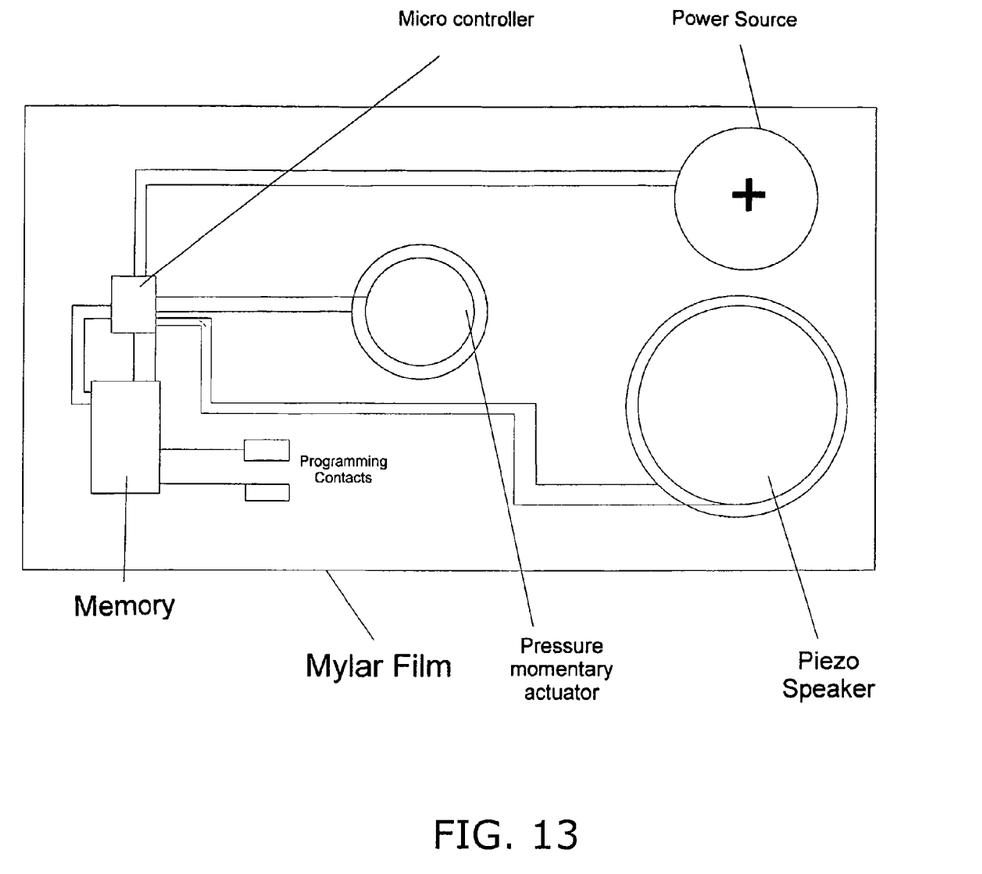
FIG. 13 is a schematic of the circuitry of the device.

As shown in FIG. 5, the actuator may be in electrical communication with the microprocessor, such that when the cap is rotated, such as in a counterclockwise direction, by a user of the product, the alarm may be shut off and the timer reset for the next interval. Another advantage to this mechanism is to store information regarding the number of times the product package has been opened and closed. The device can also store information on what times and dates the product packaging was opened and closed.

The device 100 may further comprise a global positioning system (not shown) which may provide product location. The global positioning system may also be in electrical communication with the clock such that the device 100 can keep track of the date and time for scheduling alarm intervals, or keeping track of intervals in which the device was opened by the user.

The present invention has many advantages and is versatile in its use. For example, the invention has the advantage of being helpful for visually impaired persons, as well as individuals who have to take medication, especially when there are multiple medications and multiple members of the family that are taking medications. The present invention can also assist medical personnel in emergency situations. The present invention can be used to provide information to medical personnel regarding the amount and type of medication that was consumed by the patient without the need to have the patient communicate these facts to the medical personnel. For example, in the event that the patient is unconscious or unresponsive, the present invention can store information such as identifying the type of medication, the amount taken, the date and time ingested, etc.

The present invention further has the advantage of storing and transferring information about medication taken by a patient to allow the information to be tracked, such as the distribution and sales of products sold by quantity, batch number, product name, age and location. The present invention will allow information about the medicament to be reported to a database which can indicate the type of medication or product, the demographics of the medication, and the quantity to in which it was sold.

While the invention has been described in conjunction with a limited number of embodiments, it will be appreciated by those skilled in the art that many alternative, modifications and variations in light of the foregoing description are possible. Accordingly, the present invention is intended to embrace all such alternative, modifications and variations as may fall within the spirit and scope of the invention as disclosed.

It is to be understood that the following (provisional) claims are provided by way of example only, and are not intended to limit the scope of what may be claimed in any such future application. Features may be added to or omitted from the (provisional) claims at a later date so as to further define or re-define the invention or inventions.

The invention claimed is:

1. A programmable audio device including:
    (a) a memory circuit/static memory operably connected to store audio data informational data;
    (b) an audio processor and amplifier coupled to a microcontroller;
    (c) a realtime clock and crystal operably connected to keep time for alarm circuit attached to microcontroller;
    (d) the micro controller, operably connected to run the operations;
    (e) an actuator operably connected to switch the device between an on condition and an off condition;
    (f) an actuator operably connected to switch the device between an open condition and closed condition;

(g) a speaker operably connected to emit the audio data when the device is in the on condition; and
(h) a power source operably connected to supply power to the device;
wherein the programmable audio device is configured for mounting on a consumer item, and
wherein the audio data includes information regarding the consumer item on which the programmable audio device is mounted.

2. A programmable audio device according to claim 1, further including a connection port to facilitate connection of the device to a computing device for uploading the audio data.

3. A programmable audio device according to claim 1, further including a timing device coupled to the actuator to cause the actuator to switch to an on condition at predetermined intervals.

4. A programmable audio device according to claim 1, wherein the programmable audio device is configured to be mounted on a container for dispensing a consumable.

5. A programmable audio device according to claim 1, wherein the programmable audio device is configured to be mounted on a container for dispensing medication.

6. A programmable audio device configured to be mounted on a container for dispensing a consumable, the device including:
   (a) a memory circuit/static memory operably connected to store audio data informational data;
   (b) an audio processor and amplifier coupled to a microcontroller;
   (c) a realtime clock and crystal operably connected to keep time for alarm circuit attached to the microcontroller;
   (d) the microcontroller, operably connected to run the operations;
   (e) an actuator operably connected to switch the device between an on condition and an off condition;
   (f) an actuator operably connected to switch the device between an open condition and closed condition;
   (g) a speaker operably connected to emit the audio data when the device is in the on condition;
   (h) a power source for supplying power to the device; and
   wherein the audio data includes information regarding the consumable stored within the container.

7. A programmable audio device according to claim 6 wherein the information regarding the consumable includes one or more of the following:
   (a) a description of the consumable;
   (b) a series of instructions for consuming the consumable;
   (c) a series of instructions for storing the consumable;
   (d) an expiry date of the consumable;
   (e) a description of a promotion associated with the consumable; or
   (f) a series if encrypted information for emergency services in reference to the consumable.

8. A programmable audio device according to claim 6, further including a timing device coupled to the actuator to cause the actuator to switch to an on condition at predetermined intervals.

9. A programmable audio device according to claim 8, wherein the audio data further includes an alert signal.

10. A programmable audio device according to claim 9, wherein the alert signal is an audio alert emitted at predetermined intervals.

11. A programmable audio device according to claim 6, further including a connection port to facilitate connection of the device to a computing device for uploading and or downloading the audio data and informational data.

12. A programmable audio device according to claim 6, wherein the alert signal includes a visual alert.

13. A programmable audio device according to claim 6, wherein the alert signal includes a vibratory mechanism.

* * * * *